United States Patent [19]

Bailey

[11] Patent Number: 5,309,983
[45] Date of Patent: May 10, 1994

[54] LOW PROFILE INTEGRATED HEAT SINK AND FAN ASSEMBLY

[75] Inventor: Norman W. Bailey, Sacramento, Calif.

[73] Assignee: PCubid Computer Technology Inc., Reno, Nev.

[21] Appl. No.: 39,940

[22] Filed: Mar. 29, 1993

Related U.S. Application Data

[63] Continuation-in-part of Ser. No. 902,924, Jun. 23, 1992, abandoned.

[51] Int. Cl.[5] .................................... F28F 7/00
[52] U.S. Cl. ...................... 165/80.3; 165/185; 165/122; 174/16.3; 257/722; 361/697
[58] Field of Search ............. 165/80.3, 185, 121, 165/122; 361/383, 384, 695, 697; 174/16.3; 257/713, 722, 719

[56] References Cited

U.S. PATENT DOCUMENTS

| | | |
|---|---|---|
| 3,149,666 | 9/1964 | Coe . |
| 3,220,471 | 11/1965 | Coe . |
| 3,285,328 | 11/1966 | Woodward ............... 165/185 |
| 3,313,339 | 4/1967 | Coe . |
| 4,513,812 | 4/1985 | Papst et al. ............... 165/80.2 |
| 4,715,438 | 12/1987 | Gabuzda et al. ......... 165/185 |
| 4,753,290 | 6/1988 | Gabuzda ................... 165/185 |
| 4,823,869 | 4/1989 | Arnold et al. ............ 165/185 |
| 4,879,891 | 11/1989 | Hinshaw ................... 165/80.3 |
| 4,884,331 | 12/1989 | Hinshaw ................... 165/80.3 |
| 5,132,780 | 7/1992 | Higgins, III .............. 165/80.3 |

OTHER PUBLICATIONS

Thermalloy Inc. "TCM TM : Thermalloy Cooling Modules" Nov. 1991.
Aavid Engineering Inc "PGA Clip-On Heat Sinks for Intel 486 Microprocessor" 1992.
PCubid Computer Technology "CPU Kooler User's Manual" Oct. 1991.
Randolph, J. B. "Transistor Heat Sink" IBM Technical Disclosure Bulletin, vol. 14, No. 5, Oct. 1971, pp. 1489-1490.

Primary Examiner—John Rivell
Assistant Examiner—L. R. Leo
Attorney, Agent, or Firm—John R. Flanagan

[57] ABSTRACT

A low profile integrated assembly for dissipating heat from an electronic component includes a heat sink having a peripheral envelope, and a self-contained motorized fan unit for generating a flow of air being embedded substantially within the envelope of the heat sink. The heat sink includes a generally flat heat transferring bottom base plate and a multiplicity of elongated heat dissipating fins attached on and extending upwardly from the bottom base plate. The multiplicity of heat dissipating fins define a cavity. The fins include at least a pair of outer fins being spaced from one another and disposed along a pair of opposite sides of the base plate so as to define a pair of opposite sides of the cavity. The fins also include a plurality of inner fins disposed between the pair of spaced outer fins so as to define a bottom of the cavity being spaced above the base plate. The fan unit is disposed in the cavity and spaced above the base plate by being seated upon the inner fins and retained between the outer fins in a tight-fitting engaged relation therewith.

27 Claims, 2 Drawing Sheets

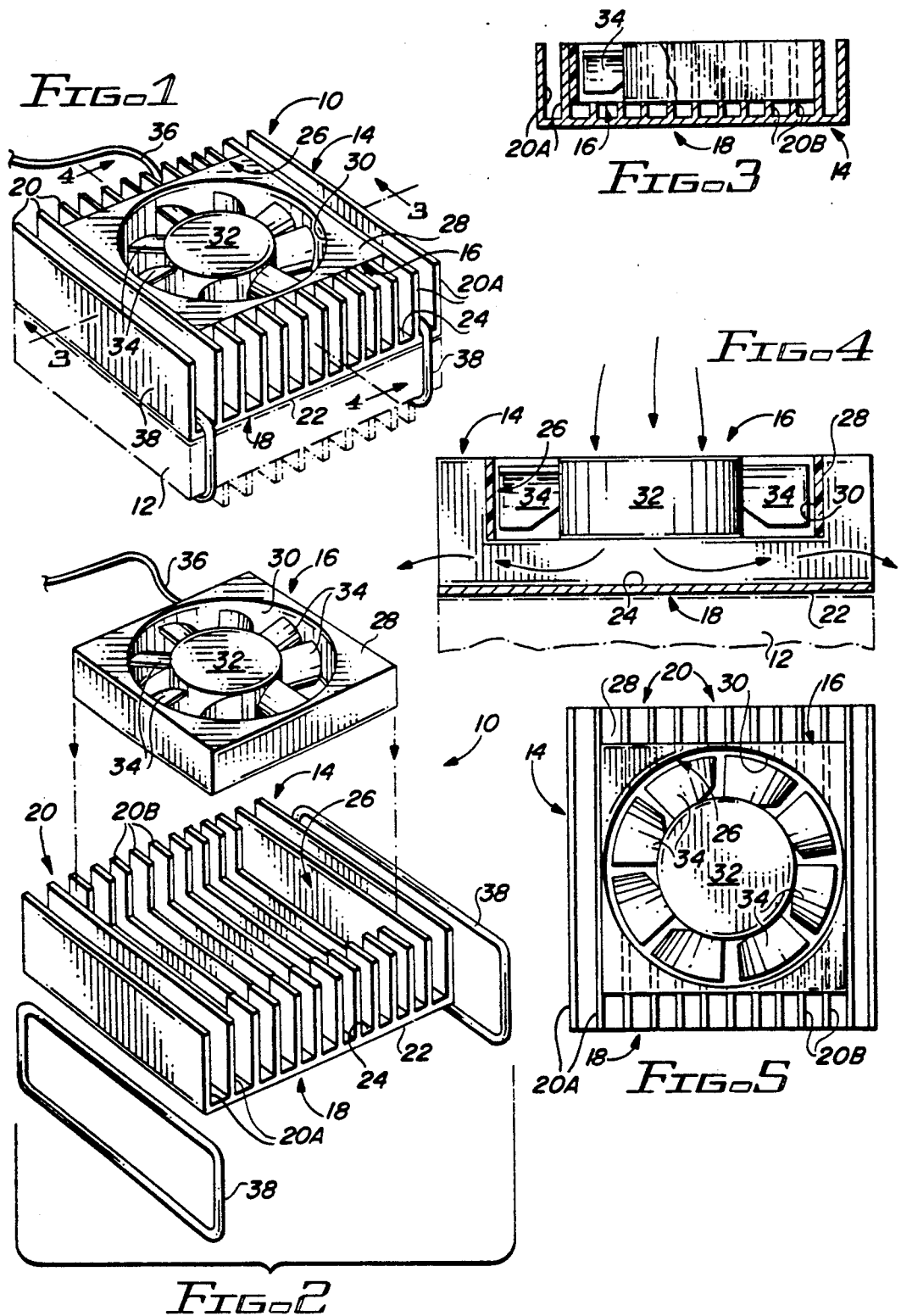

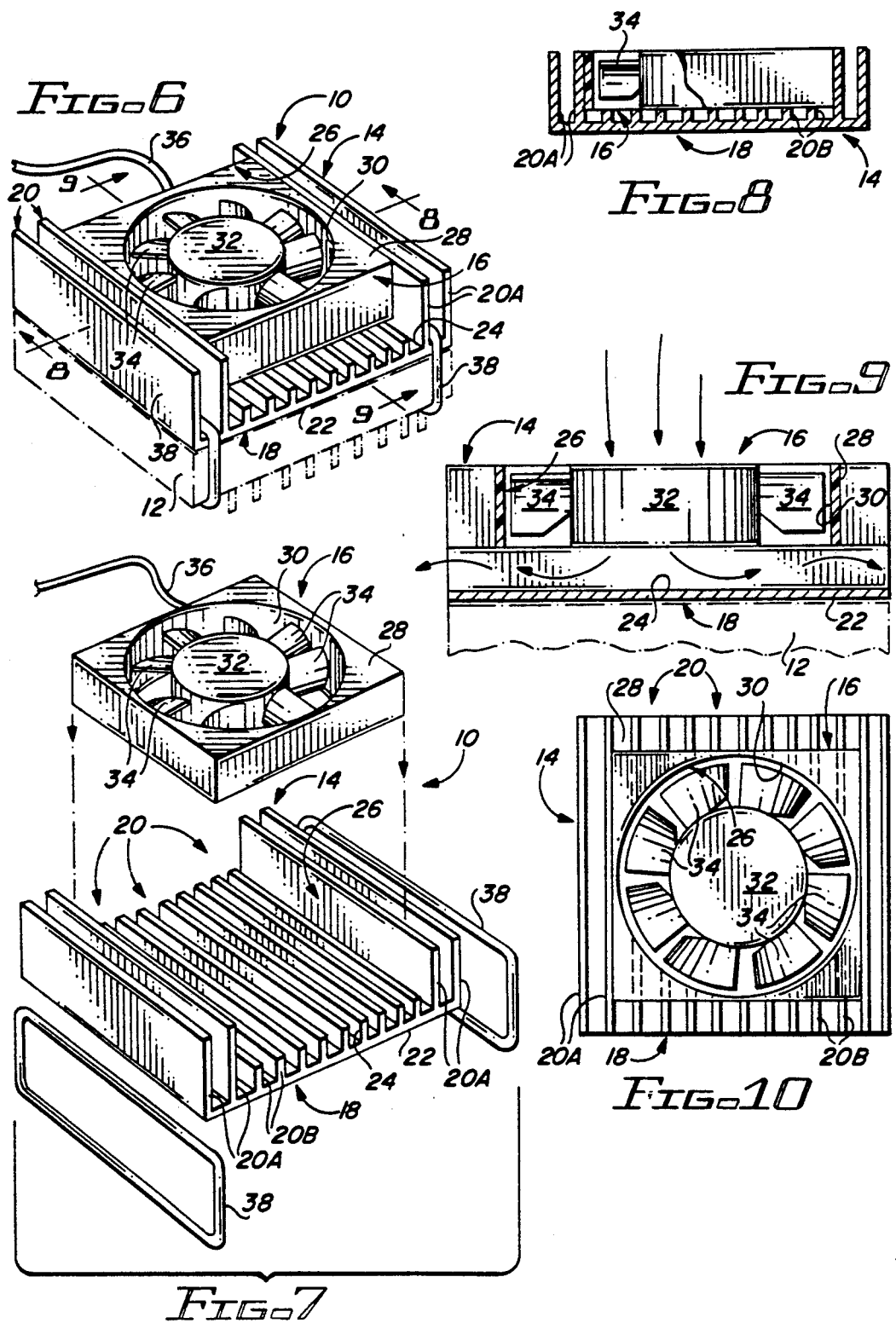

5,309,983

LOW PROFILE INTEGRATED HEAT SINK AND FAN ASSEMBLY

CROSS-REFERENCE TO RELATED APPLICATION

This application is a continuation-in-part of copending U.S. application Ser. No. 07/902,924, filed Jun. 23, 1992.

TECHNICAL FIELD

The present invention generally relates to devices for dissipation of thermal energy generated by electronic, namely semiconductor, components and, more particularly, is concerned with a low profile integrated heat sink and fan assembly.

BACKGROUND ART

Many electronic, particularly semiconductor, components generate significant heat internally during operation which must be dissipated to avoid damage to the components. In case of some components, the internally-generated heat is dissipated sufficiently by the enclosure structure, header or leads of the components. In many components, however, it has been necessary to aid the dissipation of the heat by use of heat sinks and/or fans. A variety of heat sink and fan designs have been employed for dissipation of the heat from packages containing semiconductor components.

One commercial product design currently available from the assignee of the present invention and other sources for cooling semiconductor components uses a heat sink and a self-contained motorized fan unit in a stacked assembly. The heat sink is mounted on top of the semiconductor component, such as an Intel 80486 DX or DX2 microprocessor, so as to provide heat removal from the semiconductor component to the heat sink via a thermal compound applied between them. The fan unit is then mounted on top of the heat radiating fins of the heat sink to generate a flow of air for removing the heat transferred to the heat sink from the electronic component.

The above-described commercial product has met performance expectations and operated satisfactorily by limiting the surface temperature rise of the 80486 microprocessor to a maximum within the range of about 12°–15° F. above the background temperature of the installed environment. However, the overall profile of the assembled product is undesirably high, making it difficult to properly locate the product easily on the top of the microprocessor within the computer housing where space is scarce. In view of the foregoing drawback of the above-described commercial product, a need still exists for improvements in techniques for effective heat dissipation from semiconductor components.

DISCLOSURE OF INVENTION

The present invention provides a low profile integrated heat sink and fan assembly designed to overcome the foregoing drawback and to satisfy the aforementioned need. As mentioned earlier, in the stacked assembly of the prior art commercial product the fan unit is stacked upon the heat sink so that heat removal is carried out primarily by blowing air on the heat dissipating fins of the heat sink. In contrast thereto, in the integrated assembly of the present invention the fan unit is embedded within the heat sink fins and contained substantially within an envelope defined by the heat sink fins. The fan unit is now positioned close to the heat transferring base plate of the heat sink so that heat removal is carried out primarily by impingement cooling brought about by blowing air directly on the heat sink base plate which is the portion of the heat sink that is highest in temperature by being closest to the heat generating source.

In addition, the embedding of the fan unit in the heat sink fins substantially reduces the overall height of the integrated assembly of the present invention in comparison to the stacked assembly of the prior art commercial product. The low profile of the integrated assembly of the present invention is achieved by modifying the structure of the heat sink of the prior art commercial product to bring about the embedding of fan unit in the heat sink. The portions of some of the heat dissipating fins of the prior art heat sink are removed so as to define a cavity in the heat sink being spaced above the base plate of the heat sink. It is preferred that the volume of the central cavity be substantially matched with the volume of the fan unit, in terms of their respective length, height and width dimensions, such that when the fan unit is placed in the cavity, and thereby embedded with the fins, the fan unit is substantially contained within the envelope defined by the heat sink fins and assumes a tight-fitting engaged relation with the portions of the fins of the heat sink bounding the cavity of the heat sink.

These modifications substantially reduce the height of the integrated assembly of the present invention and the volume of space utilized by the integrated assembly, compared to the stacked assembly of the prior art commercial product. Additionally, these modifications not only maintain the thermal relief achieved by the prior art commercial product, but actually reduce the temperature rise of the electronic component to a maximum within the range of about 8°–10° F. This amounts to about a 4°–5° F. reduction in temperature rise and thus from that perspective translates into about a 50% improvement in thermal performance of the new integrated assembly over the current stacked assembly.

To summarize, the integrated assembly of the present invention provides a low profile module with both substantial physical space-saving and thermal relief-enhancing improvements over the stacked assembly of the prior art commercial product.

These and other features and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

In the following detailed description, reference will be made to the attached drawings in which:

FIG. 1 is a perspective view of a first embodiment of a low profile integrated heat sink and fan assembly of the present invention in an assembled condition and anchored on an electronic component.

FIG. 2 is an exploded perspective view of the first embodiment of the integrated assembly of the present invention.

FIG. 3 is a transverse sectional view, on a reduced scale, of the integrated assembly taken along line 3—3 of FIG. 1.

FIG. 4 is a longitudinal sectional view, on an enlarged scale, of the integrated assembly taken along line 4—4 of FIG. 1.

FIG. 5 is a top plan view of the integrated assembly of FIG. 1.

FIG. 6 is a perspective view of a second embodiment of the low profile integrated heat sink and fan assembly of the present invention in an assembled condition and anchored on an electronic component.

FIG. 7 is an exploded perspective view of the second embodiment of the integrated assembly of the present invention.

FIG. 8 is a transverse sectional view, on a reduced scale, of the integrated assembly taken along line 8—8 of FIG. 6.

FIG. 9 is a longitudinal sectional view, on an enlarged scale, of the integrated assembly taken along line 9—9 of FIG. 6.

FIG. 10 is a top plan view of the integrated assembly of FIG. 6.

BEST MODE FOR CARRYING OUT THE INVENTION

Referring to the drawings, and particularly to FIGS. 1 and 6, there is illustrated first and second embodiments of a low profile integrated heat sink and fan assembly of the present invention, being generally designated 10, for improved utilization of the space about and dissipation of the heat generated internally by an electronic component 12, such as for example an Intel 80486 DX microprocessor.

In accordance with the principles of the present invention, the first embodiment of the integrated assembly 10 of FIGS. 1–5 and the second embodiments of the integrated assembly 10 of FIGS. 6–10 each basically includes a heat sink 14 having a peripheral envelope defined by the external profile of the heat sink 14 and a self-contained motorized fan unit 16 embedded substantially within the envelope of the heat sink 14 and capable of generating an air flow toward the heat sink 14. The heat sink 14 is generally constructed of suitable metallic materials, such as aluminum, aluminum alloys, copper, and copper alloys, which have high coefficients of thermal conduction. The fan unit 16 is electrically powered and per se is an off-the-shelf component. There are suitable models commercially available from a number of different suppliers.

The heat sink 14 of both embodiments of the integrated assembly 10 includes a generally flat heat transferring bottom base plate 18 and a multiplicity of heat dissipating elements 20, preferably, in the form of generally parallel, transversely-spaced, longitudinally-extending elongated thin fins 20. Of course, the fins 20 can be provided in other suitable configurations and patterns. The bottom base plate 18 of the heat sink 14 has a pair of opposite surfaces 22, 24, which solely for the sake of clarity and brevity will be referred to as the lower and upper surfaces 22, 24. When the heat sink 14 is properly applied on the electronic component 12, the lower surface 22 of the heat sink 14 faces toward the electronic component 12. A heat transferring relation is established between the lower surface 22 of the heat sink base plate 18 and the top surface of the electronic component 12 by the application of a suitable thermal compound (not shown) therebetween. The upper surface 24 of the heat sink base plate 18 faces in the opposite direction away from the electronic component 12.

The multiplicity of heat dissipating fins 20 are disposed upright on the upper surface 24 of the heat sink 14 and project away from the electronic component 12. The heat dissipating fins 20 are mounted by an integral, or any other suitably rigid, attachment on the bottom base plate 18 of the heat sink 14. The fins 20 are of substantially greater length than height and of substantially greater height than thickness. In one example of the heat sink 14, each fin 20 is 1.890 inches in length, 0.550 inch in height, and 0.050 inch in thickness.

The multiplicity of heat dissipating fins 20 of the heat sink 14 define a cavity 26. The fins 20 include at least one or a pair of outer fins 20A being spaced from one another and disposed along a pair of opposite sides of the bottom base plate 18 so as to define a pair of opposite sides of the cavity 26. The fins 20 also include a plurality of inner fins 20B disposed between the pair of spaced outer fins 20A so as to define a bottom of the cavity 26 being spaced above the bottom base plate 18. The fan unit 16 is disposed in the cavity 26 withing the heat sink 14 and spaced above the bottom base plate 18 by being seated upon the inner fins 20B and retained between at least the outer fins 20A in a tight-fitting engaged relation with the outer fins 20A.

In the first embodiment of the integrated assembly 10 of FIGS. 1–5, the inner fins 20B have longitudinally-extending centrally-located generally rectangular portions or regions of substantial length which have been cutout, eliminated or otherwise removed, such as by machining or other suitable techniques during fabrication of the heat sink 14. The elimination of these portions of the inner fins 20B define the cavity 26 within which the fan unit 16 is removably embedded in accordance with the present invention in the heat sink 14. The eliminated central portions of the inner fins 20B do not extend completely down to the base plate 18 such that the central portions of the inner fins 20B that remain will dispose and support the fan unit 16 in the cavity 26 spaced a desired distance above the upper surface 24 of the base plate 18. The opposite end portions of the inner fins 20B extend upwardly from the base plate 18 to the same height of the outer fins 20A, whereas the remaining central portions of the inner fins 20B extend upwardly from the base plate 18 to a height which is substantially less than the height of the outer fins 20A.

By way of example, in the first embodiment of the integrated assembly 10 illustrated in FIGS. 1–5, the nine most-centrally located fins out of a total of thirteen fins are the inner fins 20B. Two of the thirteen fins along each of the opposite sides of the base plate 18 are the outer fins 20A. Also, in the one example of the heat sink 14 referred to earlier, the length of each cutout is 1.585 inches and the height of the remaining portions of the inner fins 20B located below the cavity 26 is 0.156 inch above the upper surface 24 of the base plate 18. Thus, the height of the remaining portions of the inner fins 20B is less than one-third of the height of the outer fins 20A and of the opposite end portions of the inner fins 20B.

In the second embodiment of the integrated assembly 10 of FIGS. 6–10, the components which are the same as the components of the first embodiment of FIGS. 1–5, are identified by the same reference numerals. The difference between the first and second embodiments is that now, in the second embodiment of FIGS. 6–10, the longitudinally-extending generally rectangular portions or regions of the plurality of the heat dissipating inner fins 20A are cutout, eliminated or otherwise removed from end-to-end, such as by machining or other suitable techniques during fabrication of the heat sink 14, to define the cavity 26, within which the fan unit 16 is removably embedded in accordance with the present invention, extending from one end to the opposite end of the heat sink 14. However, as in the first embodiment, the eliminated portions of the inner fins 20B in the second embodiment do not extend completely down to the base plate 18 such that the portions of the inner fins 20B that remain will dispose and support the fan unit 16 in the cavity 26 spaced a desired distance above the upper surface 24 of the base plate 18. In the second embodiment, the heat sink 14 has either one or two outer fins 20A of substantially the same height as the fan unit 16 extending along opposite sides of the fan unit 16. Now these outer fins 20A together with the base plate 18 define the envelope of the heat sink 14.

The detailed components of the self-contained motorized fan unit 16 of the integrated assembly 10 do not form any part of the present invention. Thus, the fan unit 16 need only be described briefly and illustrated in a diagrammatic form herein. The fan unit 16 basically has a peripheral housing 28 defining a central opening 30 extending between opposite sides thereof. The fan unit 16 also has a central rotor 32 rotatably mounted to the peripheral housing 28 by radially-extending braces (not shown) with a plurality of radial blades 34 being mounted in circumferentially spaced relation to one another about the central rotor 32. The rotor 32 is rotatably driven relative to the peripheral housing 28 by an electric motor (not shown) built into the housing 28 and having electrical conductor leads 36 for electrical connection to any suitable source of electrical power.

Preferably, the size of the central cavity 26 in the heat sink 16 is designed to match, within close tolerances, the volume of the cavity 26 with the volume of the self-contained motorized fan unit 16, in terms of their respective lengths, width and height dimensions. Therefore, when the fan unit 16 is placed into the cavity 26, and thus embedded within the fins 20 of the heat sink 14, the fan unit 16 is substantially contained within the cavity 26 and thereby within an envelope defined by the outer edges of the heat sink fins 20 in a tight-fitting engaged relation with the portions of the outer and inner fins 20A, 20B of the heat sink 14 bounding the cavity 26 of the heat sink 14. Such tight-fitting engaged relation is all that is needed to retain the fan unit 16 embedded in the heat sink 14 regardless of whether the fan unit is fully or only partially embedded within the fins 20. However, other techniques can be utilized within the purview of the present invention to retain the fan unit 16 within the cavity 26 of the heat sink 14.

It is also within the purview of the present invention that the fan unit 16 be only partially disposed within the cavity 26 of the heat sink 14 and thus only partially embedded within the heat sink fins 20. However, it should be realized that embedding of the fan unit 16 substantially all of the way within the heat sink 14 is preferred in order to obtain the full measure of the benefits of the present invention in terms of space savings and thermal relief.

In view that in both embodiments the embedded fan unit 16 is positioned close to the base plate 18 of the heat sink 14 by the inner fins 20B, heat removal will be carried out primarily by impingement cooling brought about by blowing air in the direction of the arrows in FIGS. 4 and 9 directly on the bottom base plate 18 and then outwardly through passageways defined between the fan unit and the bottom base plate 18. The bottom base plate 18 is the portion of the heat sink 14 closest to the heat generating source, the electronic component 12, and thus highest in temperature. The embedding of the fan unit 16 not only maintains the thermal relief achieved by the stacked assembly of the prior art commercial product, but actually reduces the maximum temperature rise of the electronic component 12 above ambient even farther. The maximum is now within the range of about 8°–10° F. instead of within the range of about 12°–15° F. as in the case of the prior art stacked assembly. This amounts to about a 4°–5° F. reduction in temperature rise and thus from this perspective translates into about a 50% improvement in thermal performance of the new integrated assembly over the current stacked assembly. Also, the embedding of the fan unit 16 within the heat sink fins 20 and substantially within their envelope substantially reduces the overall height of and volume of space occupied by the integrated assembly 10 of the present invention, in comparison to the stacked assembly of the prior art commercial product, by the proportion of the fan unit 14 that is embedded within the heat sink fins 20 and do not now extend thereabove.

The integrated assembly 10 of the heat sink 14 with the embedded fan unit 16 can be retained on the electronic component 12 by any suitable means. One highly advantageous means is a pair of stretchible elastic endless members 38 made of an elastomeric material, such as off-the-shelf O-rings, which are shown in FIGS. 1 and 2. The elastic endless members 38 are applied over the undersides of the opposite end portions of the electronic component 12 and over the upper surface of the opposite end portions of the base plate 18 of the heat sink 14.

To summarize, the integrated heat sink and fan assembly 10 of the present invention provides a low profile module with both substantial physical space-saving and thermal relief-enhancing improvements over the stacked assembly of the prior art commercial product.

It is thought that the present invention and its advantages will be understood from the foregoing description and it will be apparent that various changes may be made thereto without departing from its spirit and scope of the invention or sacrificing all of its material advantages, the form hereinbefore described being merely preferred or exemplary embodiment thereof.

I claim:

1. A low profile integrated assembly for dissipating heat from an electronic component, said assembly comprising:
   (a) a heat sink for dissipating heat from an electronic component, said heat sink having a bottom base plate and means attached on said base plate and extending upwardly therefrom for defining a peripheral envelope and a cavity within said envelope; and
   (b) a self-contained motorized fan unit disposed substantially within said cavity and said envelope of said heat sink, said fan unit being operable for generating a flow of air into said heat sink to effect impingement cooling of a portion of said heat sink located adjacent to the electronic component;
   (c) said envelope and cavity defining means of said heat sink including a plurality of elements stationarily attached on said bottom base plate and extending upwardly therefrom for supporting said fan unit in spaced relation above said bottom base plate so as to define a passageway between said bottom base plate and said fan unit for passing the flow of air over said bottom base plate.

2. The assembly of claim 1 wherein said means for defining said envelope and said cavity includes at least a pair of outer fins attached on said bottom base plate and extending upwardly therefrom, each of said outer fins being spaced from the other and disposed along one of a pair of opposite sides of said bottom base plate so as to define a pair of opposite sides of said cavity and retain said fan unit therebetween.

3. The assembly of claim 1 wherein said cavity has a volume being substantially matched with a volume of said fan unit, in terms of the width and height dimensions of said cavity and fan unit, such that said fan unit is substantially contained within said cavity.

4. The assembly of claim 1 further comprising:
means for retaining said heat sink on the electronic component, said retaining means being a pair of endless members of elastic stretchible material capable of stretching around portions of the heat sink and electronic component.

5. A low profile integrated assembly for dissipating heat from an electronic component, said assembly comprising:
  (a) a heat sink for dissipating heat from an electronic component, said heat sink having a bottom base plate and means attached on said base plate and extending upwardly therefrom for defining a peripheral envelope and a cavity within said envelope; and
  (b) a self-contained motorized fan unit disposed substantially within said cavity and said envelope of said heat sink, said fan unit being operable for generating a flow of air into said heat sink to effect impingement cooling of a portion of said heat sink located adjacent to the electronic component, said envelope and cavity defining means including a plurality of elements forming a bottom of said cavity and supporting said fan unit in spaced relation above said bottom base plate so as to define passageways between said bottom base plate and said fan unit for passing the flow of air over said bottom base plate;
  (c) said means for defining said envelope and said cavity including at least a pair of outer fins attached on said bottom base plate and extending upwardly therefrom, each of said outer fins being spaced from the other and disposed along one of a pair of opposite sides of said bottom base plate so as to define a pair of opposite sides of said cavity and retain said fan unit therebetween;
  (d) said plurality of elements defining said bottom of said cavity including a plurality of inner fins attached on said bottom base plate and extending upwardly therefrom, said inner fins being disposed between said pair of spaced outer fins so as to define said bottom of said cavity in a spaced relation above said bottom base plate, said fan unit being disposed in said cavity and spaced above said bottom base plate by being seated upon said inner fins and retained between said outer fins in a tight-fitting engaged relation with said outer fins.

6. The assembly of claim 5 wherein the lengths of said fins are substantially greater than the heights thereof.

7. The assembly of claim 5 wherein portions of said inner fins below said fan unit are shorter in height than said outer fins.

8. The assembly of claim 5 wherein said inner fins are substantially uniform in height throughout their lengths and are shorter in height than said outer fins.

9. The assembly of claim 5 wherein said inner fins have central portions disposed below said fan unit that are shorter in height than said outer fins and have opposite end portions disposed adjacent to opposite ends of said fan unit that are of substantially the same height as said outer fins.

10. A low profile integrated assembly for dissipating heat from an electronic component, said assembly comprising:
  (a) a heat sink having a bottom base plate for placement in a heat transferring relation with an electronic component for dissipating heat therefrom, said heat sink also having a multiplicity of elements attached on said base plate and projecting upwardly therefrom for providing a heat dissipating function and defining a peripheral envelope and a cavity within said envelope; and
  (b) a self-contained motorized fan unit at least partially embedded within said cavity and contained within said envelope defined by said heat sink elements and being operable for generating a flow of air into said heat sink to effect impingement cooling of a portion of said heat sink located adjacent to the electronic component;
  (c) said multiplicity of elements of said heat sink including a plurality of said elements being stationarily attached on said bottom base plate and extending upwardly therefrom for supporting said fan unit in spaced relation above said bottom base plate so as to define a passageway between said bottom base plate and said fan unit for passing the flow of air over said bottom base plate.

11. The assembly of claim 10 wherein said multiplicity of elements defining said envelope and said cavity includes at least a pair of outer fins attached on said bottom base plate and extending upwardly therefrom, each of said outer fins being spaced from the other and disposed along one of a pair of opposite sides of said bottom base plate so as to define a pair of opposite sides of said cavity and retain said fan unit therebetween.

12. The assembly of claim 10 further comprising:
means for retaining said heat sink on the electronic component, said retaining means being a pair of endless members of elastic stretchible material capable of stretching around portions of the heat sink and electronic component.

13. A low profile integrated assembly for dissipating heat from an electronic component, said assembly comprising:
  (a) a heat sink having a bottom base plate for placement in a heat transferring relation with an electronic component for dissipating heat therefrom, said heat sink also having a multiplicity of elements attached on said base plate and projecting upwardly therefrom for providing a heat dissipating function and defining a peripheral envelope and a cavity within said envelope; and
  (b) a self-contained motorized fan unit at least partially embedded within said cavity and contained within said envelope defined by said heat sink elements and being operable for generating a flow of air into said heat sink to effect impingement cooling of a portion of said heat sink located adjacent to the electronic component, said plurality of elements forming a bottom of said cavity and supporting said fan unit in spaced relation above said bottom base plate so as to define passageways between said bottom base plate and said fan unit for passing the flow of air over said bottom base plate;

(c) said multiplicity of elements defining said envelope and said cavity including at least a pair of outer fins attache on said bottom base plate and extending upwardly therefrom, each of said outer fins being spaced from the other and disposed along one of sa pair of opposite sides of said bottom base plate so as to define a pair of opposite sides of said cavity and retain said fan unit therebetween;

(d) said multiplicity of elements defining said envelope and said cavity including a plurality of inner fins attached on said bottom base plate and extending upwardly therefrom, said inner fins being spaced apart from one another disposed between said par of spaced outer fins so as to define said bottom of said cavity in a spaced relation above said bottom base plate, said fan unit being disposed in said cavity and spaced above said bottom base plate by being seated upon said inner fins and retained between said outer fins in a tight-fitting engaged relation with said outer fins.

14. The assembly of claim 13 wherein the lengths of said fins are substantially greater than the the heights thereof.

15. The assembly of claim 13 wherein portions of said inner fins below said fan unit are shorter in height than said outer fins.

16. The assembly of claim 13 wherein said inner fins are substantially uniform in height throughout their lengths and are shorter in height than said outer fins.

17. The assembly of claim 13 wherein said inner fins have central portions disposed below said fan unit that are shorter in height than said outer fins and have opposite end portions disposed adjacent to opposite end of said fan unit that are of substantially the same height as said outer fins.

18. A heat sink for use in holding for a self-contained motorized fan unit in a heat transferring relation to an electronic component, said heat sink comprising:

(a) a bottom base plate adapted for placement upon the electronic component; and (b) a multiplicity of elements defining a peripheral envelope and a cavity within said envelope adapted for seating the self-contained motorized fan unit;

(c) said multiplicity of elements including at least a pair of outer elements attached on said bottom base plate and extending upwardly therefrom, each of said outer elements being spaced from the other and disposed along one of a pair of opposite sides of said bottom base plate so as to define a pair of opposite sides of said cavity adapted to retain the fan unit therebetween;

(d) said multiplicity of elements also including a plurality of inner elements attached on said bottom base plate and extending upwardly therefrom, said inner elements being spaced apart from one another disposed between said par of spaced outer elements so as to define said bottom of said cavity in a spaced relation above said bottom base plate, said inner elements also including stationary portions shorter in height than said outer elements relative to said bottom base plate so as to adapt said portions of said inner elements to seat the fan unit thereupon within said cavity.

19. The heat sink of claim 18 wherein said outer and inner elements are greater in length than in height.

20. The heat sink of claim 18 wherein portions of said inner elements disposed below said cavity are shorter in height than said outer elements.

21. The heat sink of claim 18 wherein said inner elements are substantially uniform in height throughout their lengths and are shorter in height than said outer elements.

22. The heat sink of claim 18 wherein said inner elements have central portions disposed below said cavity that are shorter in height than said outer elements and have opposite end portions disposed adjacent to opposite ends of said cavity that are of substantially the same height as said outer elements.

23. A heat sink for use in holding for a self-contained motorized fan unit in a heat transferring relation to an electronic component, said heat sink comprising:

(a) a bottom base plate adapted for placement upon the electronic component; and (b) a multiplicity of elongated fins attached on said bottom base plate and extending upwardly therefrom, said multiplicity of elongated fins also extending substantially parallel with one another and being laterally spaced spaced from one another, said multiplicity of elongated fins defining a peripheral envelope and a cavity within said envelope adapted for seating the self-contained motorized fan unit;

(c) said multiplicity of elongated fins including at least a pair of outer elongated fins attached on said bottom base plate and extending upwardly therefrom, each of said outer elongated fins being spaced from the other and disposed along one of a pair of opposite sides of said bottom base plate so as to define a pair of opposite sides of said cavity adapted to retain the fan unit therebetween;

(d) said multiplicity of elongated fins also including a plurality of inner elongated fins attache on said bottom base plate and extending upwardly therefrom, said inner elongated fins being spaced apart from one another disposed between said pair of spaced outer elongated fins so as to define said bottom of said cavity in a spaced relation above said bottom base plate, said inner elongated fins also including stationary portions shorter in height than said outer elongated fins relative to said bottom base pale so as to adapt said portions of said inner elongated fins to seat the fan unit thereupon within said cavity.

24. The heat sink of claim 23 wherein said outer and inner elongated fins are greater in length than in height.

25. The heat sink of claim 23 wherein portions of said inner elongated fins disposed below said cavity are shorter in height than said outer elongated fins.

26. The heat sink of claim 23 wherein said inner elongated fins are substantially uniform in height throughout their lengths and are shorter in height than said outer elongated fins.

27. The heat sink of claim 23 wherein said inner elongated fins have central portions disposed below said cavity that are shorter in height than said outer elongated fins and have opposite end portions disposed adjacent to opposite ends of said cavity that are of substantially the same height as said outer elongated fins.

* * * * *

REEXAMINATION CERTIFICATE (3122nd)

United States Patent [19]
Bailey

[11] B1 5,309,983
[45] Certificate Issued Feb. 4, 1997

[54] LOW PROFILE INTEGRATED HEAT SINK AND FAN ASSEMBLY

[75] Inventor: Norman W. Bailey, Sacramento, Calif.

[73] Assignee: PCubid Computer Technology Inc., Reno, Nev.

Reexamination Request:
No. 90/004,025, Nov. 16, 1995

Reexamination Certificate for:
Patent No.: 5,309,983
Issued: May 10, 1994
Appl. No.: 39,940
Filed: Mar. 29, 1993

Related U.S. Application Data

[63] Continuation-in-part of Ser. No. 902,924, Jun. 23, 1992, abandoned.
[51] Int. Cl.$^6$ .................................................. F28F 7/00
[52] U.S. Cl. .................. 165/80.3; 165/122; 165/185; 174/16.3; 257/722; 361/697
[58] Field of Search .................. 165/80.3, 122, 165/185; 174/16.3; 257/719, 722; 361/695, 697

[56] References Cited

FOREIGN PATENT DOCUMENTS 52686  12/1983  Japan .

*Primary Examiner*—Leonard R. Leo

[57] ABSTRACT

A low profile integrated assembly for dissipating heat from an electronic component includes a heat sink having a peripheral envelope, and a self-contained motorized fan unit for generating a flow of air being embedded substantially within the envelope of the heat sink. The heat sink includes a generally flat heat transferring bottom base plate and a multiplicity of elongated heat dissipating fins attached on and extending upwardly from the bottom base plate. The multiplicity of heat dissipating fins define a cavity. The fins include at least a pair of outer fins being spaced from one another and disposed along a pair of oppposite sides of the base plate so as to define a pair of opposite sides of the cavity. The fins also include a plurality of inner fins disposed between the pair of spaced outer fins so as to define a bottom of the cavity being spaced above the base plate. The fan unit is disposed in the cavity and spaced above the base plate by being seated upon the inner fins and retained between the outer fins in a tight-fitting engaged relation therewith.

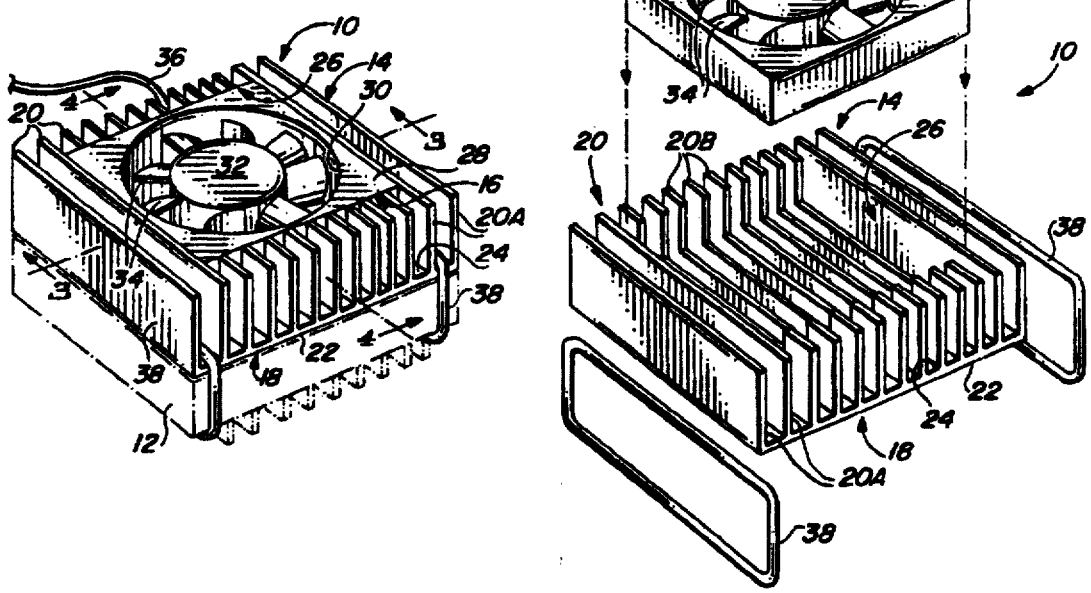

REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1-27 are cancelled.

* * * * *